United States Patent
Yang et al.

(10) Patent No.: US 10,673,111 B2
(45) Date of Patent: Jun. 2, 2020

(54) FILTERING UNIT AND FILTER

(71) Applicant: Huawei Technologies Co., Ltd., Shenzhen (CN)

(72) Inventors: Bingzheng Yang, Chengdu (CN); Huizhen Qian, Chengdu (CN); Xun Luo, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 64 days.

(21) Appl. No.: 15/965,390

(22) Filed: Apr. 27, 2018

(65) Prior Publication Data

US 2018/0248243 A1 Aug. 30, 2018

Related U.S. Application Data

(63) Continuation of application No. PCT/CN2016/081900, filed on May 12, 2016.

(51) Int. Cl.
| | | |
|---|---|---|
| *H01P 1/201* | (2006.01) | |
| *H01P 3/00* | (2006.01) | |
| *H01P 1/203* | (2006.01) | |
| *H01P 7/08* | (2006.01) | |
| *H01P 5/08* | (2006.01) | |

(Continued)

(52) U.S. Cl.
CPC .......... *H01P 1/2013* (2013.01); *H01P 1/2039* (2013.01); *H01P 3/006* (2013.01); *H01P 5/08* (2013.01); *H01P 7/086* (2013.01); *H01L 23/66* (2013.01); *H01P 3/003* (2013.01); *H01P 5/028* (2013.01)

(58) Field of Classification Search
CPC ...... H01P 1/2013; H01P 1/2016; H01P 3/003; H01P 3/006; H01P 5/028
USPC ........................................................ 333/208
See application file for complete search history.

(56) References Cited

U.S. PATENT DOCUMENTS

| 5,142,255 A | 8/1992 | Chang et al. |
| 6,166,612 A | 12/2000 | Tsujiguchi |

(Continued)

FOREIGN PATENT DOCUMENTS

| CN | 1956256 A | 5/2007 |
| CN | 100359753 C | 1/2008 |

(Continued)

OTHER PUBLICATIONS

Machine Translation and Abstract of Chinese Publication No. CN1956256, May 2, 2007, 12 pages.

(Continued)

*Primary Examiner* — Rakesh B Patel
(74) *Attorney, Agent, or Firm* — Conley Rose, P.C.

(57) ABSTRACT

A filter is provided, and the filter includes two mutually coupled slow-wave resonators. Each resonator includes a coplanar waveguide (CPW) transmission line, a tapered CPW transmission line, and a ground stub, and can generate a slow-wave feature to push a high-order harmonic wave of a baseband signal to a high frequency, so as to implement a wide stopband feature. In addition, a slow-wave effect is used to properly design a size of a filter, to reduce an entire area of the filter and reduce costs. Moreover, two resonators are coupled, to enhance passband performance of the filter, increase bandwidth, increase in-passband flatness, and reduce an insertion loss.

20 Claims, 7 Drawing Sheets

(51) Int. Cl.
*H01P 5/02* (2006.01)
*H01L 23/66* (2006.01)

(56) References Cited

U.S. PATENT DOCUMENTS

| | | | |
|---|---|---|---|
| 2005/0088259 A1 | 4/2005 | Satoh et al. | |
| 2005/0206480 A1 | 9/2005 | Satoh et al. | |
| 2005/0206481 A1* | 9/2005 | Koizumi | H01P 1/2013 333/204 |
| 2010/0259344 A1* | 10/2010 | Nosaka | H03H 5/02 333/219.1 |
| 2014/0167876 A1* | 6/2014 | Fast | H01P 3/08 333/34 |

FOREIGN PATENT DOCUMENTS

| | | | |
|---|---|---|---|
| CN | 101179145 A | 5/2008 | |
| CN | 101359760 A | 2/2009 | |
| CN | 101431172 A | 5/2009 | |
| CN | 201478427 U | 5/2010 | |
| CN | 103219570 A | 7/2013 | |
| CN | 104953205 A | 9/2015 | |
| JP | H01223752 A | 9/1989 | |
| JP | H11220304 A | 8/1999 | |
| JP | 2005102200 A | 4/2005 | |
| JP | 2005253042 A | 9/2005 | |

OTHER PUBLICATIONS

Machine Translation and Abstract of Chinese Publication No. CN101359760, Feb. 4, 2009, 10 pages.
Machine Translation and Abstract of Chinese Publication No. CN101431172, May 13, 2009, 19 pages.
Machine Translation and Abstract of Chinese Publication No. CN104953205, Sep. 30, 2015, 8 pages.
Machine Translation and Abstract of Chinese Publication No. CN201478427, May 19, 2010, 6 pages.
Chen, Y., et al., "Coplanar Waveguide Bandpass Filter with Hollow-T Shaped Transmission-Line Resonator for Multiple Spurious Suppression," WAMICON, 2013, 3 pages.
Huang, F., "Suppression of Harmonics in Microstrip Filters Using a Combination of Techniques," IEEE Transactions on Microwave Theory and Techniques, vol. 63, No. 10, Oct. 2015, pp. 3453-3461.
Foreign Communication From a Counterpart Application, PCT Application No. PCT/CN2016/081900, English Translation of International Search Report dated Feb. 13, 2017, 3 pages.
Machine Translation and Abstract of Japanese Publication No. JP2005253042, Sep. 15, 2005, 34 pages.
Machine Translation and Abstract of Japanese Publication No. JPH01223752, Part 1, Sep. 6, 1989, 4 pages.
Machine Translation and Abstract of Japanese Publication No. JPH01223752, Part 2, Sep. 6, 1989, 2 pages.
Sanada, A., et al. "Fabrication of MOD-Derived YBCO Films on (001)LaAlO3 and Their Application to λ/4 CPW SIR BPFs," IEEE Trans. Microwave Theory and Techniques, vol. 50, No. 12, Dec. 2002, pp. 2856-2861.
Foreign Communication From a Counterpart Application, Japanese Application No. 2018-521070, Japanese Office Action dated Jan. 22, 2019, 5 pages.
Foreign Communication From a Counterpart Application, Japanese Application No. 2018-521070, English Translation of Japanese Office Action dated Jan. 22, 2019, 6 pages.
Machine Translation and Abstract of Chinese Publication No. CN103219570, Jul. 24, 2013, 12 pages.
Machine Translation and Abstract of Japanese Publication No. JP2005102200, Apr. 14, 2005, 42 pages.
Foreign Communication From a Counterpart Application, European Application No. 16901295.2, Extended European Search Report dated Nov. 9, 2018, 10 pages.
Machine Translation and Abstract of Chinese Publication No. CN101179145, May 14, 2008, 21 pages.
Foreign Communication From a Counterpart Application, Chinese Application No. 201680052473.3, Chinese Search Report dated Jan. 28, 2019, 2 pages.
Foreign Communication From a Counterpart Application, Chinese Application No. 201680052473.3, Chinese Office Action dated Feb. 3, 2019, 4 pages.

* cited by examiner

FILTERING UNIT AND FILTER

CROSS-REFERENCE TO RELATED APPLICATIONS

This application is a continuation of International Application No. PCT/CN2016/081900, filed on May 12, 2016, the disclosure of which is hereby incorporated by reference in its entirety.

TECHNICAL FIELD

The present disclosure relates to the field of communications technologies, and in particular, to a filtering unit and a filter.

BACKGROUND

With development of communications technologies, an operating frequency band of a communications system is increasingly wide, and the communications system also receives more unwanted signals and various types of noise. Therefore, a modern communications system needs to strongly suppress out-of-band signals, and has a more complex design. A filter having a favorable out-of-band suppression function can greatly simplify complexity of the communications system, simplify a design, and reduce costs. In an existing filter with a wide stopband, a high-order harmonic wave of a baseband signal is suppressed by increasing transmission zeroes in many designs. In addition, in some filters, a wide stopband is generated in a stepped impedance resonator (SIR) manner.

In a prior-art solution, a series of short-circuit lines is added to a quarter-wave coplanar waveguide (CPW) resonator, to generate extra out-of-passband transmission zeroes. These transmission zeroes may be used to suppress harmonic waves, to implement relatively favorable out-of-band suppression. In addition, multiple identical resonators are cascaded in this solution, to enhance an out-of-band harmonic-wave suppression effect. However, a stopband in this solution can be expanded to only five times of a baseband signal. Moreover, a filter area designed in this technical solution is relatively large, and costs are relatively high.

In another solution, a hybrid structure of a microstrip and a CPW is used. The microstrip and the CPW may be mutually converted to generate extra open-circuit lines, to generate transmission zeroes. Likewise, these transmission zeroes can be used to suppress a high-order harmonic wave of a baseband signal. However, in this technical solution, similarly, a stopband can be suppressed to only 6.52 times of a baseband signal, and an area is relatively large. This causes higher costs of an entire filter.

SUMMARY

The present disclosure provides a filtering unit and a filter, so as to improve a wide stopband feature of the filtering unit, and reduce an area of the filtering unit, thereby facilitating miniaturization development of the filtering unit.

To achieve the foregoing effects, the present disclosure provides a filtering unit, where the filtering unit includes two coupled CPW slow-wave resonance units, where each resonance unit includes a substrate, and a CPW transmission line, a tapered CPW transmission line, and a ground stub that are disposed on the substrate; the CPW transmission line includes a first central signal line and a first ground plane arranged on each of two sides of the first central signal line, and a first insulation slot with an invariable width is disposed between the first central signal line and the first ground plane; the tapered CPW transmission line includes a second central signal line connected to the first central signal line and a second ground plane arranged on each of two sides of the second central signal line, and a second insulation slot with a tapered width is disposed between the second central signal line and the second ground plane; and the ground stub is connected between second central signal lines of the two slow-wave resonance units, and one end of the ground stub which is far away from the second central signal line is connected to the second ground plane.

In the foregoing technical solution, a resonance unit that includes a CPW transmission line, a tapered CPW transmission line, and a ground stub is used to generate a slow-wave feature, to push a high-order harmonic wave of a baseband signal to a high frequency, so as to implement a wide stopband feature. In addition, a slow-wave effect is used to properly design a size of a filter, to reduce an entire area of the filter and reduce costs.

In a specific configuration manner, an edge of the second insulation slot which is far away from the second central signal line is a straight line or an arc line. That is, a width of the second insulation slot only needs to gradually change. A width of an end close to the CPW transmission line may be greater than a width of an end far away from the CPW transmission line, or a width of an end close to the CPW transmission line may be less than a width of an end far away from the CPW transmission line. The edge of the second insulation slot which is far away from the second central signal line may be in different shapes, for example, different shapes such as the foregoing arc line and the foregoing straight line.

In addition, in a specific implementation, the two coupled slow-wave resonance units are symmetrically disposed. The filtering unit is easily disposed by symmetrically configuring the two coupled slow-wave resonance units, and performance of the filtering unit is improved.

Preferably, the first ground plane and the second ground plane on a same side of the first central signal line and the second central signal line are connected together. In this way, the ground plane is easily disposed.

The present disclosure further provides a filter, including at least one filtering unit described above. Two adjacent filtering units in multiple filtering units (if there are such units) are electrically coupled or magnetically coupled. The filter further includes a transmission line with a stepped impedance change, and the transmission line with the stepped impedance change is used as an output transmission line or an input transmission line, to couple with at least one slow-wave resonance unit in the filtering unit.

In the foregoing technical solution, a filtering unit that includes a CPW transmission line, a tapered CPW transmission line, and a ground stub is used to generate a slow-wave feature, to push a high-order harmonic wave of a baseband signal to a high frequency, so as to implement a wide stopband feature. In addition, a slow-wave effect is used to properly design a size of a filter, to reduce an entire area of the filter and reduce costs. In addition, a low-pass filter feature is obtained in a signal transmission manner from a low impedance to a high impedance, to introduce multiple transmission zeroes, and enhance a stopband suppression degree; and a relatively large reflection coefficient is obtained on a high frequency band, and radiation generated by the slow-wave resonance unit is suppressed. In a specific implementation, the transmission line with the stepped impedance change is a T-shaped transmission line, and there is a third ground plane on each of two sides of the T-shaped transmission line.

In a specific configuration manner, the filter is a passband filter.

Preferably, the first ground plane, the second ground plane, and the third ground plane that are on a same side of the first central signal line, the second central signal line, and the T-shaped transmission line are connected together. In this way, the ground plane is easily disposed.

Moreover, to improve performance of the filtering unit, the first ground plane on each of two sides of the first central signal line, the second ground plane on each of two sides of the second central signal line, and the third ground plane on each of two sides of the T-shaped transmission line are connected together using a connection component. Electric potentials of grounds on two sides are equal using the connection component, to implement better filter performance.

The connection component may be disposed using different structures. In a specific solution, the connection component is a metal jumper wire or an air bridge.

When the connection component is disposed on the filtering unit, two ends of the connection component are respectively disposed on two sides of the T-shaped transmission line, and the connection component crosses the T-shaped transmission line and is insulated from the T-shaped transmission line.

A specific manner of coupling between two filtering units is as follows. When two adjacent filtering units are magnetically coupled, two adjacent CPW transmission lines in the two adjacent filtering units are connected together.

When the two adjacent filtering units are electrically coupled, there is a gap between first signal lines of two adjacent CPW transmission lines in the two adjacent filtering units.

Figure 1:
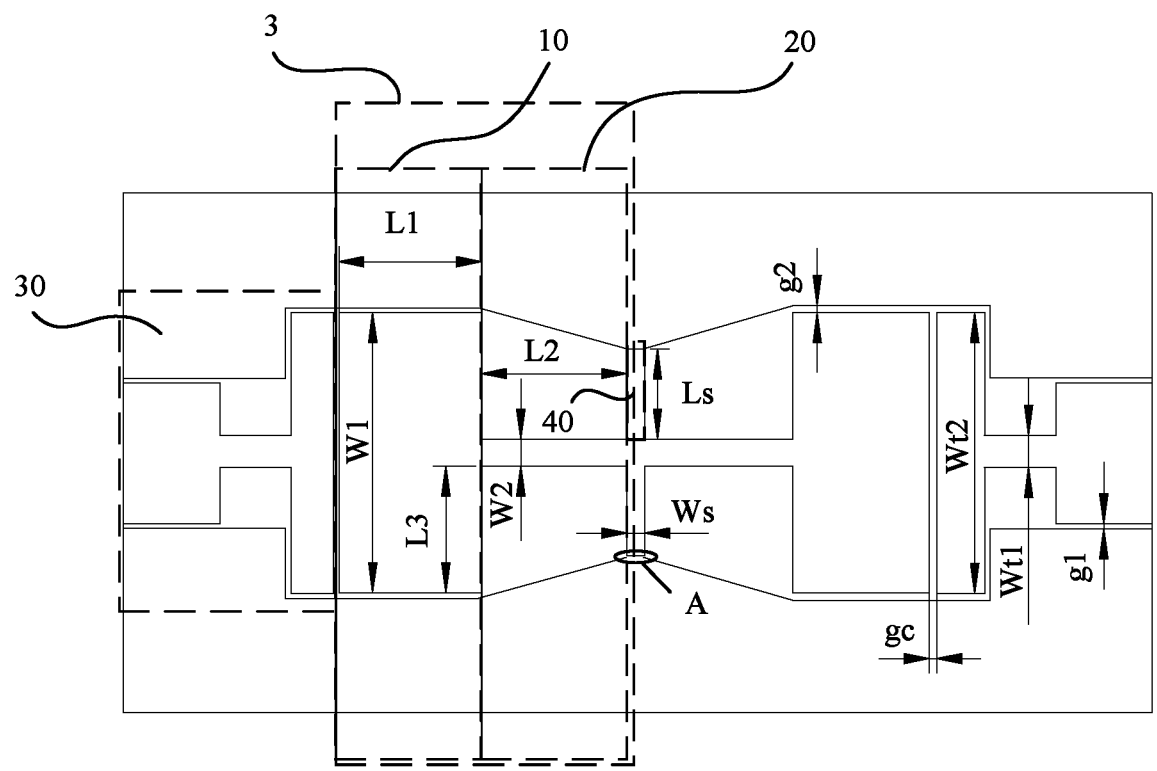
FIG. 1 is a schematic structural diagram of a filter according to an embodiment of the present disclosure.

Reference Numerals: 1: Substrate; 2: Metal layer; 3: Slow-wave resonance unit; 10: CPW transmission line; 11: First central signal line; 12: First ground plane; 13: First insulation slot; 20: Tapered CPW transmission line; 21: Second central signal line; 22: Second ground plane; 23: Second insulation slot; 24: Edge; 30: T-shaped transmission line; 40: Ground stub; 50: Connection component; 60: Filtering unit; 61: Gap.

DESCRIPTION OF EMBODIMENTS

To make the objectives, technical solutions, and advantages of the present disclosure clearer, the following further describes the present disclosure in detail with reference to the accompanying drawings. The described embodiments are merely a part rather than all of the embodiments of the present disclosure. All other embodiments obtained by a person of ordinary skill in the art based on the embodiments of the present disclosure without creative efforts shall fall within the protection scope of the present disclosure.

Figure 2:
FIG. 2 is a side view of a filter according to an embodiment of the present disclosure.
Figure 3:
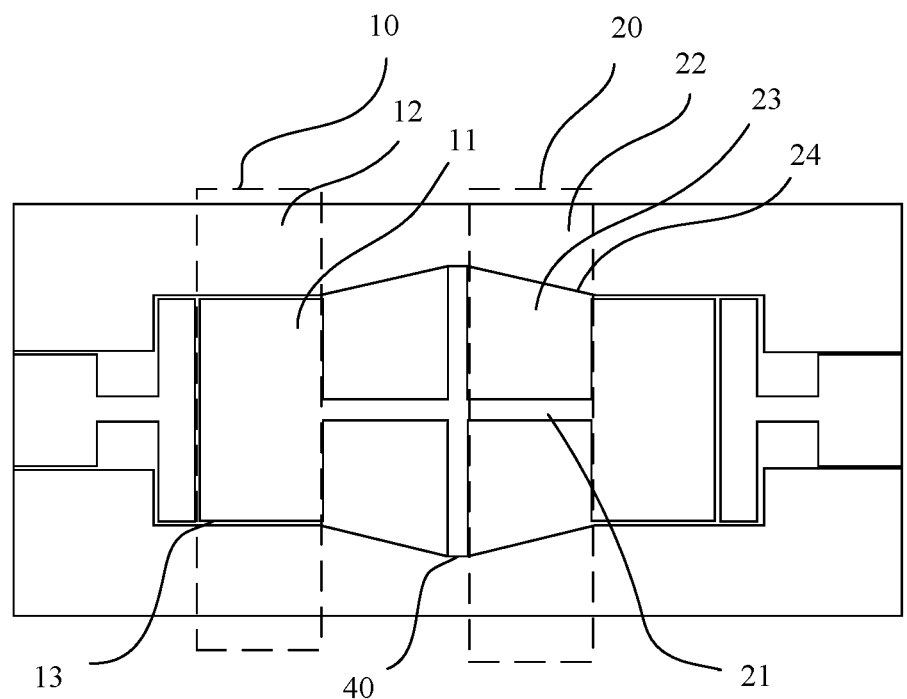
FIG. 3 is another schematic structural diagram of a filter according to an embodiment of the present disclosure.
Figure 4:
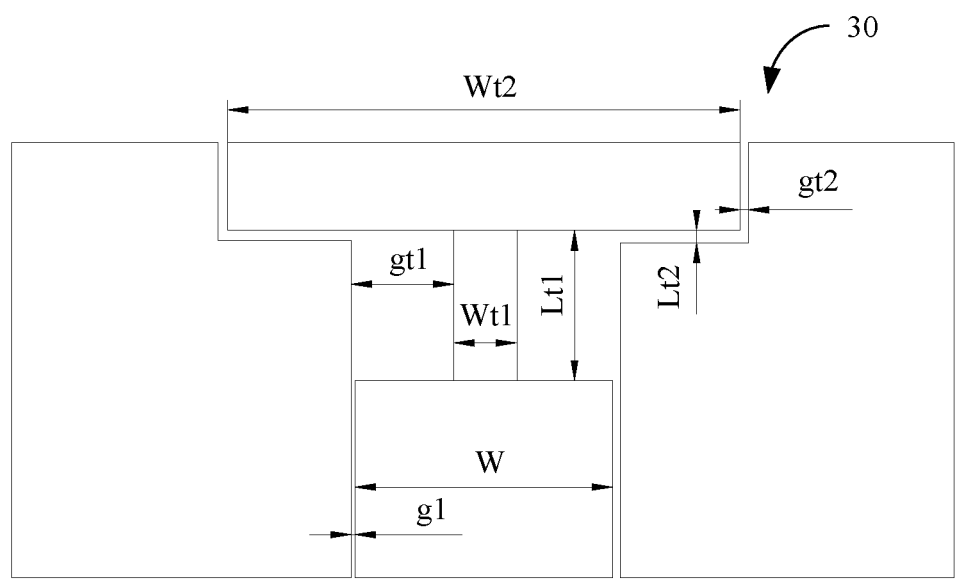
FIG. 4 is a schematic structural diagram of a T-shaped transmission line of a filter according to an embodiment of the present disclosure.

As shown in FIG. 1, FIG. 2, and FIG. 3, FIG. 1 and FIG. 3 are two schematic structural diagrams of a filter according to an embodiment of the present disclosure, and FIG. 2 is a side view of a filtering unit according to an embodiment of the present disclosure. Optionally, the filter may be a second-order filter.

To achieve the foregoing effects, an embodiment of the present disclosure provides a filtering unit. The filtering unit includes two coupled CPW slow-wave resonance units 3. Each slow-wave resonance unit 3 includes a substrate 1, and a CPW transmission line 10, a tapered CPW transmission line 20, and a ground stub 40 that are disposed on the substrate 1.

The CPW transmission line 10 includes a first central signal line 11 and a first ground plane 12 arranged on each of two sides of the first central signal line 11, and a first insulation slot 13 with an invariable width is disposed between the first central signal line 11 and the first ground plane 12; the tapered CPW transmission line 20 includes a second central signal line 21 connected to the first central signal line 11 and a second ground plane 22 arranged on each of two sides of the second central signal line 21, and a second insulation slot 23 with a tapered width is disposed between the second central signal line 21 and the second ground plane 22; and the ground stub 40 is connected between second central signal lines 21 of the two slow-wave resonance units 3, and one end A of the ground stub 40 which is far away from the second central signal line 21 is connected to the second ground plane 22.

In the foregoing embodiment, a filtering unit that includes a CPW transmission line 10, a tapered CPW transmission line 20, and a ground stub 40 is used to generate a slow-wave feature, to push a high-order harmonic wave of a baseband signal to a high frequency, so as to implement a wide stopband feature. In addition, a slow-wave effect is used to properly design a size of a filter, to reduce an entire area of the filter and reduce costs.

To easily understand a structure and a principle of the filtering unit provided in this embodiment, the following describes the filtering unit in detail with reference to a specific accompanying drawing and embodiment.

Continuing to refer to the filtering unit that includes two coupled slow-wave resonance units 3 and that is provided in the embodiment in FIG. 1, the filtering unit includes two CPW transmission lines 10, two tapered CPW transmission lines 20, and two ground stubs 40. The foregoing structures are formed on one substrate 1. As shown in FIG. 2, a metal layer 2 is formed on the substrate 1, and the foregoing structures are formed by means of etching. In addition, the two slow-wave resonance units 3 may be disposed using a symmetric structure, or using an asymmetric structure. Preferably, the two slow-wave resonance units 3 are symmetrically disposed, to facilitate configuration of the filtering unit, and improve performance of the filtering unit.

The two CPW transmission lines 10 are conventional CPW transmission lines, a width and a length of the first central signal line 11 of the CPW transmission line 10 are W1 and L1, and widths of the first insulation slots 13 on two sides of the first central signal line 11 remain unchanged and are g2.

In the two tapered CPW transmission lines 20, a width and a length of the second central signal line 21 are W2 and L2, and slot widths of the second insulation slots 23 on two sides of the second central signal line 21 linearly change. In the structure shown in FIG. 1, the slot width of the second insulation slot 23 gradually changes from L3+g2 to Ls.

Widths and lengths of two ground stubs 40 on two sides of the second central signal line 21 are Ws and Ls.

A center frequency of a filter is decided by a physical size of the resonance unit in the foregoing embodiment. A total sum of electrical lengths is L (L=W1+L1+L2+L3+Ls), that is, approximate to 90 degrees in the center frequency of the filter. In addition, a longer actual physical length corresponds to a longer electrical length in a specific frequency. Therefore, the center frequency of the band-pass filter can be reduced by increasing the sizes of W1, L1, L2, L3, and Ls.

Within a stopband range of the filter, an electric field is mainly on two sides that are of the first central signal line 11 and are close to a ground, an edge of the tapered CPW transmission line 20, and an edge of the ground stub 40; a magnetic field is mainly on an edge of the first central signal line 11 which is close to the second insulation slot 23. This means that when the foregoing filtering unit is used to form a filter, an extremely strong equivalent capacitance and equivalent inductance (where the electric field corresponds to the equivalent capacitance, and the magnetic field corresponds to the equivalent inductance) is formed between a signal input port and a ground point, so that signals within the stopband flow into a ground (GND) from the input port using a ground point A. In this way, a slow-wave feature is generated, and a high-order harmonic wave of a baseband signal is pushed to a high frequency, so as to implement a wide stopband feature. In addition, a slow-wave effect is used to properly design a size of a filter, to reduce an entire area of the filter and reduce costs.

In the foregoing embodiment, two vertically symmetric slow-wave resonance units 3 with a same size are mutually coupled, to enhance passband performance of the filter, increase a bandwidth, increase in-passband flatness, and reduce an insertion loss. Strength of coupling between the two resonance units may be described using a coupling coefficient k, and both the length Ls and the width Ws of the ground stub 40 affect the coupling coefficient k between the two resonance units. The coupling coefficient k is increased when Ls is increased or Ws is decreased, so as to increase a bandwidth of the filter.

In the foregoing embodiment, the width of the second insulation slot 23 in the tapered CPW transmission line 20 gradually changes. In an example of one second insulation slot 23 thereof, two ends of the second insulation slot 23 are respectively a first end (an end with a width of L1+g2 shown in FIG. 1) close to the first central signal line 11 and a second end (an end with a width of Ls shown in FIG. 1) far away from the first central signal line 11. In this change, a width of the first end may be greater than a width of the second end (as shown in FIG. 1), or a width of the first end may be less than a width of the second end (as shown in FIG. 3). In addition, during specific configuration, an edge 24 of the second insulation slot 23 which is far away from the second central signal line 21 may be in different shapes. For example, the edge 24 of the second insulation slot 23 which is far away from the second central signal line 21 is a straight line or an arc line. When the edge 24 is an arc line, the arc line may be a concave arc line or a convex arc line. The shape may be designed according to an actual performance requirement of the filter.

In a specific configuration process, as shown in FIG. 1, the ground planes between the CPW transmission lines 10 and the tapered CPW transmission lines 20 are an integrated structure (in a ground on a same side of the first central signal line 11), and the first insulation slot 13 and the second insulation slot 23 are also connected.

Continuing to refer to FIG. 1 and FIG. 3, in this embodiment, the first ground plane 12 and the second ground plane 22 that are on a same side of the first central signal line 11 and the second central signal line 21 are connected together. That is, the first ground plane 12 and the second ground plane 22 on the same side are an integrated structure, so that electric potentials (that is, voltages) of the first ground plane 12 and the second ground plane 22 are equal, to implement better filter performance.

Continuing to refer to FIG. 1, FIG. 2, and FIG. 3, an embodiment of the present disclosure further provides a filter. The filter includes at least one filtering unit described above. If there are multiple filtering units, two adjacent filtering units thereof are electrically coupled or magnetically coupled. The filter further includes a transmission line with a stepped impedance change, and the transmission line is used as an output transmission line or an input transmission line or as an input/output port, to couple with at least one slow-wave resonance unit 3 in the filtering unit.

In the foregoing embodiment, referring to both FIG. 1 and FIG. 3, a filtering unit 60 that includes a CPW transmission line 10, a tapered CPW transmission line 20, and a ground stub 40 is used to generate a slow-wave feature, to push a high-order harmonic wave of a baseband signal to a high frequency, so as to implement a wide stopband feature. In addition, a slow-wave effect is used to properly design a size of a filter, to reduce an entire area of the filter and reduce costs. In each filtering unit, two vertically symmetric slow-wave resonance units 3 with a same size are mutually coupled, to enhance passband performance of the filter, increase a bandwidth, increase in-passband flatness, and reduce an insertion loss. Strength of coupling between the two resonance units may be described using a coupling coefficient k, and both the length Ls and the width Ws of the ground stub 40 affect the coupling coefficient k between the two resonance units. The coupling coefficient k is increased when Ls is increased or Ws is decreased, so as to increase a bandwidth of the filter.

In addition, a low-pass filter feature is obtained in a signal transmission manner from a low impedance to a high impedance, to introduce multiple transmission zeroes, and increase a stopband suppression degree; and a relatively large reflection factor is obtained on a high frequency band, to suppress radiation generated by the slow-wave resonance units 3. In a specific implementation, the transmission line with a stepped impedance change is a T-shaped transmission line 30, and a third ground plane is disposed on each of two sides of the T-shaped transmission line 30. The T-shaped transmission line 30 of a stepped impedance change is used as an input or output port. In the T-shaped transmission line 30, a section with a width of W is a 50-ohm CPW transmission line, and a slot width on each of two sides of the 50-ohm CPW transmission line is g1, to meet a radio-frequency circuit standard. A signal is transmitted in a manner in which gap coupling is performed between a section Wt2 and the slow-wave resonance unit 3. In a section Lt1 of the T-shaped transmission line 30, a characteristic impedance (greater than 50 ohms) of this section of the CPW transmission line 10 may be increased when Wt1 is decreased and gt1 is increased. A low-pass filter feature is obtained in a signal transmission manner from a low impedance (with a width of W) to a high impedance (with a width of Wt1), to introduce multiple transmission zeroes, and increase a stopband suppression degree; and a relatively large reflection factor is obtained on a high frequency band, to suppress radiation generated by the slow-wave resonance units 3. The T-shaped transmission line 30 of a step impedance is used as an input port or an output port, and affects an external quality factor Qe of the filter. A definition of the external quality factor Qe is as follows:

$$Qe = \frac{f_0}{\Delta f_{3dB}},$$

where f0 represents a center frequency of the filter, and Δf3 decibel (dB) represents 3 dB bandwidth of the filter. The external quality factor Qe is decreased when Wt2 is increased, and gc is decreased, so as to increase a bandwidth of the filter. In a specific embodiment, the filter is a passband filter.

Figure 5:
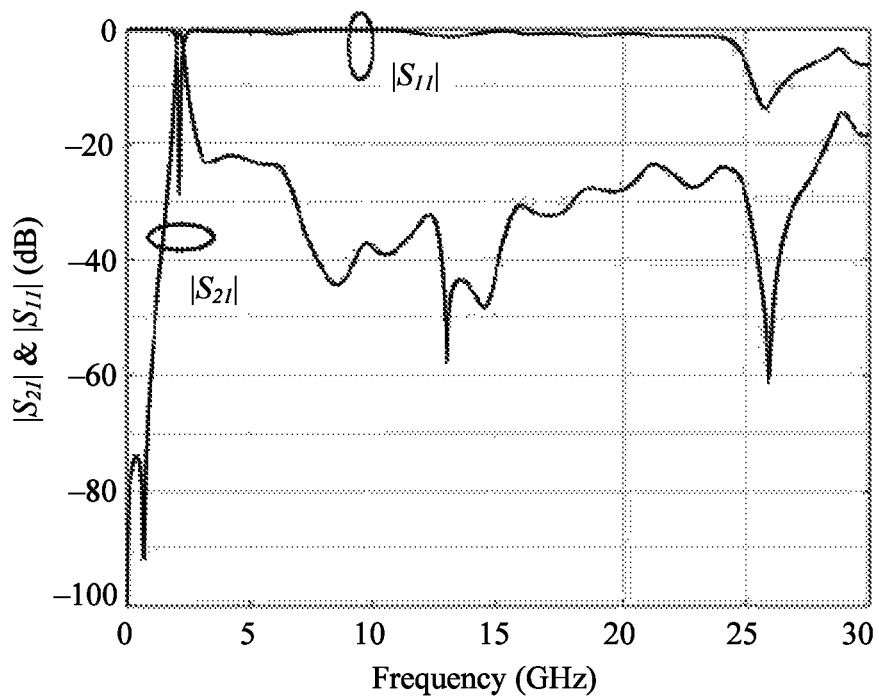
FIG. 5 shows an emulation frequency response of a filter according to an embodiment of the present disclosure.
Figure 6:
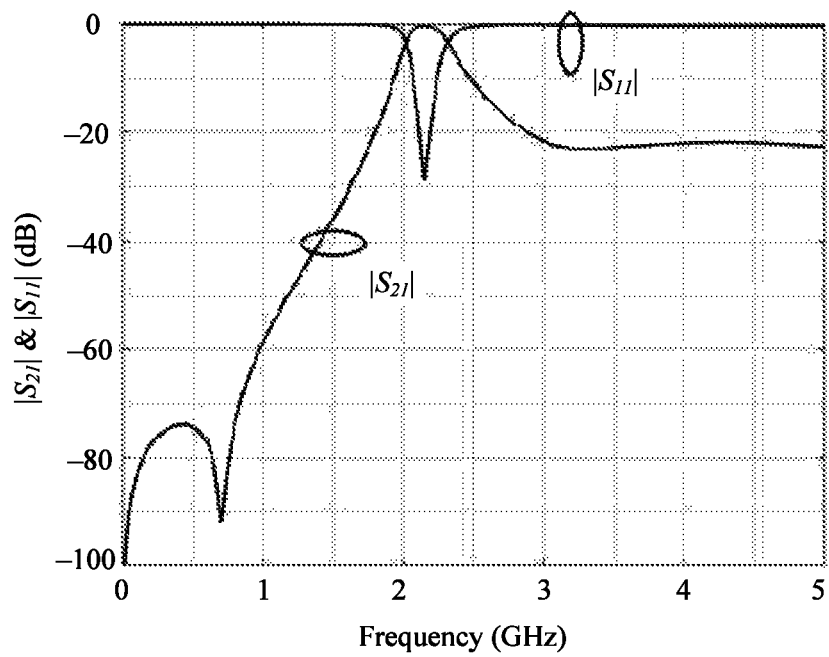
FIG. 6 shows an emulation frequency response of a filter when a frequency is from 0 to 5 gigahertz (GHz) in FIG. 5.

To easily understand effects of the filter provided in this embodiment, a filter that includes a slow-wave CPW resonance unit is emulated in the following, and an emulation result is shown in FIG. 5 and FIG. 6. The emulation result shows that for the filter that includes the filtering unit provided in this embodiment, a center frequency of a passband is 2.1 GHz, a stopband may be expanded to 11.9 times of a baseband, and a suppression degree reaches −21.9 dB.

S21 and S11 are S parameters, S21 represents a transmission factor from a port 2 (an output port) to a port 1 (an input port), and S11 represents a reflection factor observed from the port 1. Both the two parameters are greater than 0 and are not greater than 1, and usually use dB as measurement. Larger S21 indicates that more energy is transmitted from the port 1 to the port 2. Relatively large S11 means that most of energy inputted from the port 1 is reflected, and does not arrive at the port 2. Therefore, the passband of the filter has relatively large S21 and relatively small S11, and S21 closer to 0 dB indicates a less energy loss in a transmission process; and the stopband of the filter has relatively small S21 and relatively large S11, and smaller S21 indicates a higher stopband suppression degree.

Figure 7:
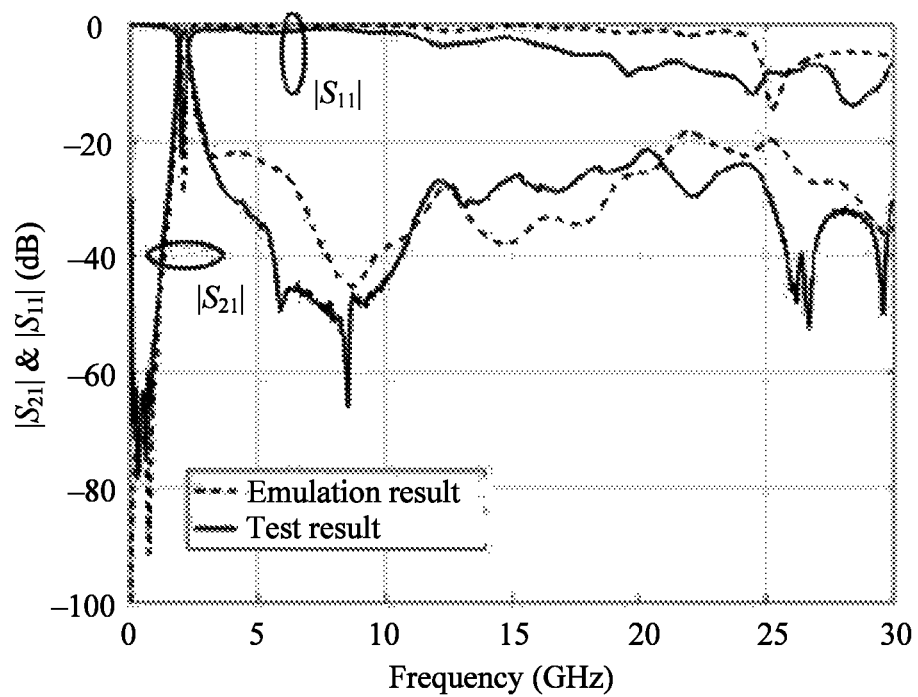
FIG. 7 is a comparison diagram of an emulation result and a test result of a filter according to an embodiment of the present disclosure.
Figure 8:
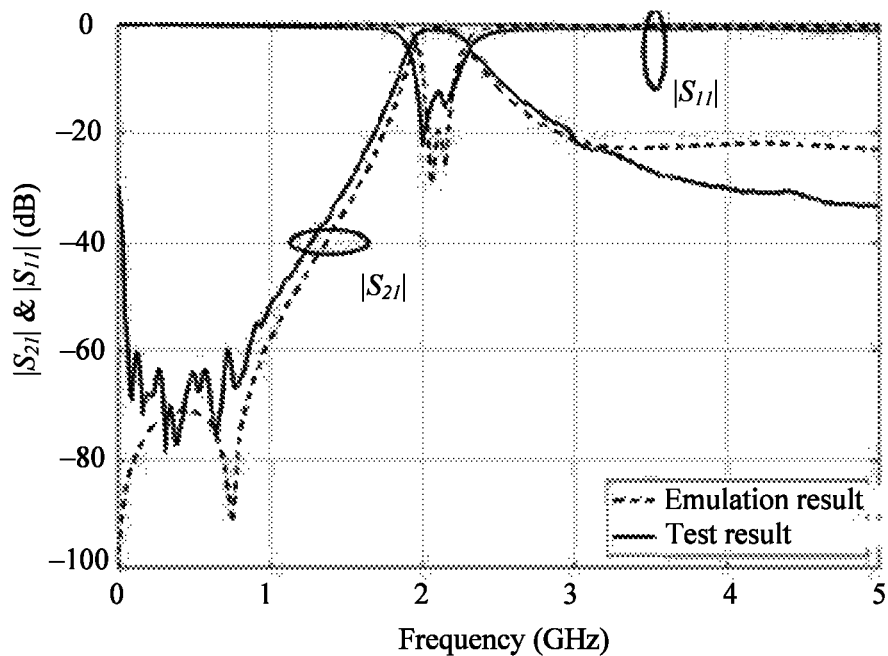
FIG. 8 is a comparison diagram of an emulation result and a test result of a filter when a frequency is from 0 to 5 GHz in FIG. 7.

As shown in FIG. 7 and FIG. 8, the band-pass filter based on the slow-wave CPW resonance unit with a wide stopband is processed and tested using a high-frequency board RT5880 (with a relative permittivity of 2.2 and a thickness of 0.508 mm), and comparison between a test result and an emulation result is shown in FIG. 7 and FIG. 8. It can be seen from FIG. 7 and FIG. 8 that for the filter provided in this embodiment, the stopband is expanded to 14.2 times of a baseband signal, a stopband suppression degree reaches −21.5 dB, and an insertion loss is less than 1.13 dB.

Figure 9:
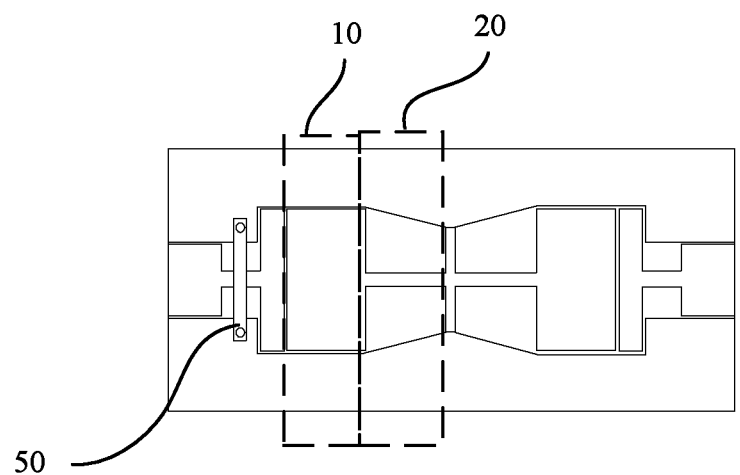
FIG. 9 is a schematic structural diagram of another filter according to an embodiment of the present disclosure.

As shown in FIG. 9, to improve performance of the filtering unit, ground planes on two sides of the first central signal line 11 are connected together using a connection component 50. That is, the first ground plane 21, the second ground plane 22, and the third ground plane that are on a same side of the first central signal line 11, the second central signal line 21, and the T-shaped transmission line 30 are connected together, so that electric potentials (that is, voltages) of the ground planes on the same side are the same. Preferably, the ground planes on two sides of the first central signal line 11 are connected together using the connection component 50. Grounds separated on up and down sides are connected using the connection component 50, so that electric potentials of the grounds on two sides are equal, to implement better filter performance.

The connection component 50 may be disposed using different structures. In a specific solution, the connection component 50 is a metal jumper wire or an air bridge. During specific configuration, two ends of the connection component 50 are respectively disposed on the third ground planes on two sides of the T-shaped transmission line, or two ends of the connection component 50 are respectively disposed on the first ground planes 12 or the second ground planes 22 on two sides of the first central signal line 11 or the second central signal line 21. That the connection component 50 is disposed on the third ground planes on two sides of the T-shaped transmission line is only a better solution. As shown in FIG. 9, the connection component 50 crosses the T-shaped transmission line and is insulated from the T-shaped transmission line. In a specific embodiment, as shown in FIG. 9, metal jumper wires are disposed on two sides of the T-shaped transmission line 30. It should be understood that a location of a single air bridge or a single metal jumper wire is not limited to the location shown in the foregoing figure. When being connected to the grounds on two sides, the single air bridge or the single metal jumper wire may be moved on the ground towards left, right, up or down, and may be rotated by a specific degree. A quantity of air bridges and a quantity of metal jumper wires that are used are not limited.

Figure 10:
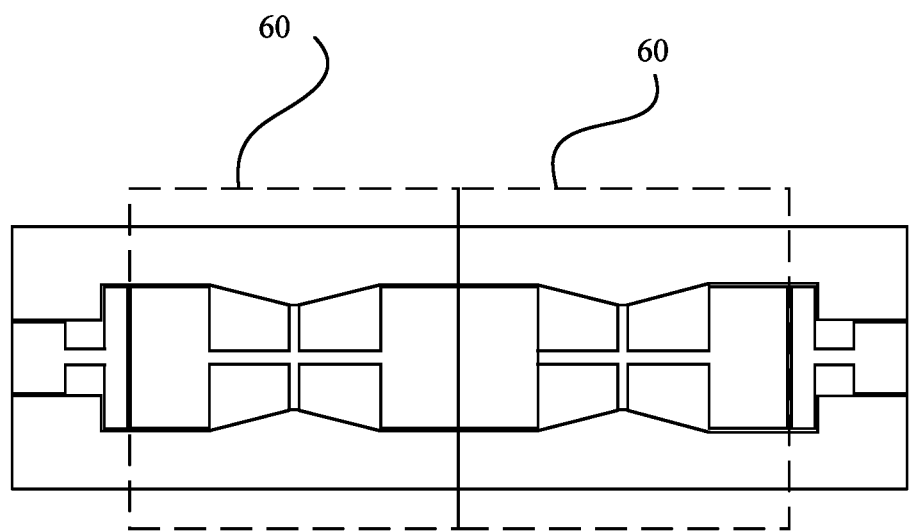
FIG. 10 is a schematic structural diagram of a filter obtained by means of cascading according to an embodiment of the present disclosure.
Figure 11:
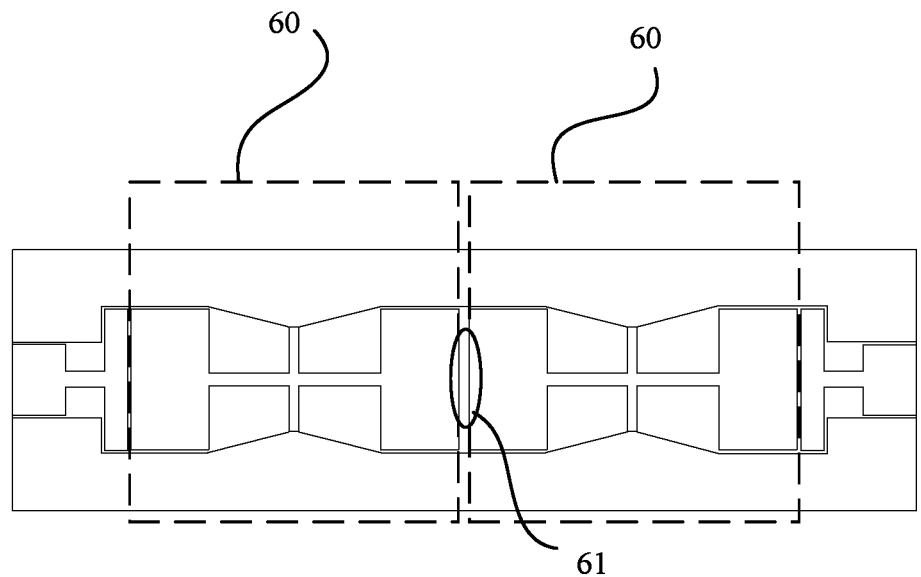
FIG. 11 is another schematic structural diagram of a filter obtained by means of cascading according to an embodiment of the present disclosure.

In addition, when multiple filtering units are used, the multiple filtering units are coupled. As shown in FIG. 10 and FIG. 11, FIG. 10 and FIG. 11 show a filter formed by coupling two filtering units. When filtering units 60 are connected, the filtering units 60 may be cascaded in a magnetic coupling or electric coupling manner. As shown in FIG. 10 and FIG. 11, when adjacent filtering units 60 are magnetically coupled, adjacent CPW transmission lines 10 in the two adjacent filtering units 60 are connected together, and overall performance is improved in a magnetic coupling manner. In addition, as shown in FIG. 11 and FIG. 10, band-pass filters may be cascaded in an electric coupling manner. When adjacent filtering units 60 are electrically coupled, there is a gap 61 between first signal lines of two adjacent CPW transmission lines 10 in the two adjacent filtering units 60. That is, the filters are not directly connected, but connected in a gap coupling manner. Both the two cascading manners are applicable to a combination of multiple filtering units 60 (whose quantity may be 2, but is not limited to 2).

Figure 12:
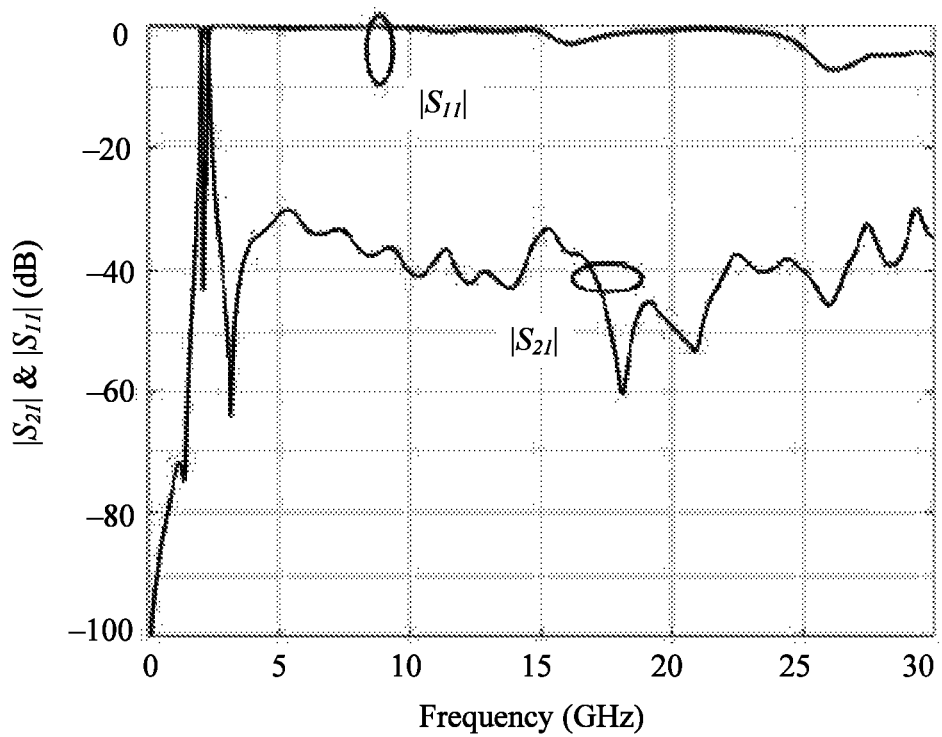
FIG. 12 shows an emulation frequency response of a filter obtained by means of cascading according to an embodiment of the present disclosure.
Figure 13:
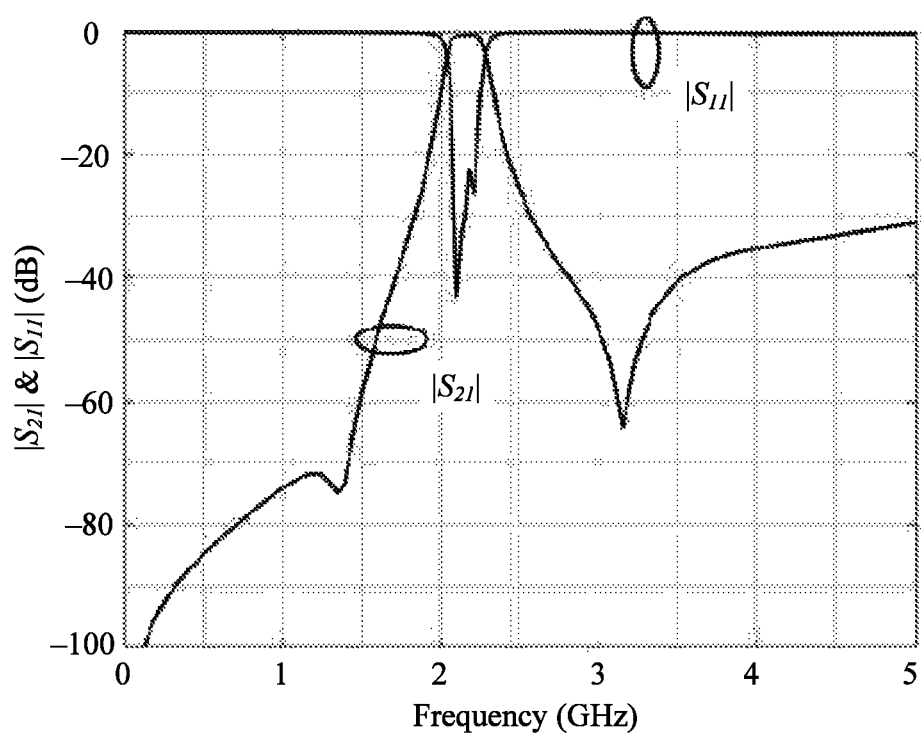
FIG. 13 shows an emulation frequency response of a filter obtained by means of cascading when a frequency is from 0 to 5 GHz in FIG. 12.

In addition, in this embodiment, as shown in FIG. 12 and FIG. 13, an emulation result of a high-performance filter formed by cascading two band-pass filters is shown in the figures when a metal jumper wire is used. A center frequency of the filter is 2.1 GHz, a stopband may be expanded to over 14.2 times of a baseband, and a suppression degree reaches −30.1 dB.

Obviously, a person skilled in the art can make various modifications and variations to the present disclosure without departing from the spirit and scope of the present disclosure. The present disclosure is intended to cover these modifications and variations provided that they fall within the scope of protection defined by the following claims and their equivalent technologies.

The invention claimed is:

1. A filter comprising two coupled coplanar waveguide (CPW) slow-wave resonators, wherein each of the two CPW slow-wave resonators comprises:
   a substrate;
   a CPW transmission line disposed on the substrate and comprising a first central signal line, wherein a first ground plane is arranged on each of two sides of the first central signal line, wherein a first insulation slot is disposed between the first central signal line and the first ground plane, and wherein a first end and a second end of the first insulation slot have a common width;
   a tapered CPW transmission line disposed on the substrate and comprising a second central signal line coupled to the first central signal line, wherein a second ground plane is arranged on each of two sides of the second central signal line, wherein a second insulation slot is disposed between the second central signal line and the second ground plane, wherein the second insulation slot comprises a tapered width from a first end of the second insulation slot to a second end of the second insulation slot, wherein the first end of the second insulation slot is closer to the first central signal line, and wherein the second end of the second insulation slot is farther from the first central signal line; and
   a ground stub disposed on the substrate and coupled between the first central signal line and the second central signal line, wherein the first end of the first insulation slot is adjacent to a first end of the ground stub, and wherein the first end of the second insulation slot is adjacent to a second end of the ground stub.

2. The filter of claim 1, wherein an edge of the second insulation slot most distant from the second central signal line is a straight line.

3. The filter of claim 1, wherein an edge of the second insulation slot most distant from the second central signal line is an arc line.

4. The filter of claim 1, wherein the two coupled CPW slow-wave resonators are symmetrically disposed.

5. The filter of claim 1, wherein the first ground plane and the second ground plane that are on a same side of the first central signal line and the second central signal line are coupled together.

6. The filter of claim 1, wherein a slot width of the second insulation slot gradually decreases from a first width to a second width, wherein the second width is less than the first width.

7. A filter comprising:
   at least one filter comprising two coupled coplanar waveguide (CPW) slow-wave resonators, wherein each of the two CPW slow-wave resonators comprises:
      a substrate;
      a CPW transmission line disposed on the substrate and comprising a first central signal line, wherein a first ground plane is arranged on each of two sides of the first central signal line, wherein a first insulation slot is disposed between the first central signal line and the first ground plane, and wherein a first end and a second end of the first insulation slot have a common width;
      a tapered CPW transmission line disposed on the substrate and comprising a second central signal line coupled to the first central signal line, wherein a second ground plane is arranged on each of two sides of the second central signal line, wherein a second insulation slot is disposed between the second central signal line and the second ground plane, wherein the second insulation slot comprises a tapered width from a first end of the second insulation slot to a second end of the second insulation slot, wherein the first end of the second insulation slot is closer to the first central signal line, and wherein the second end of the second insulation slot is farther from the first central signal line; and
      a ground stub disposed on the substrate and coupled between the first central signal line and the second central signal line, wherein the first end of the first insulation slot is adjacent to a first end of the ground stub, and wherein the first end of the second insulation slot is adjacent to a second end of the ground stub; and
   a transmission line with a stepped impedance change that is used as an output transmission line or an input transmission line to couple with at least one of the two CPW slow-wave resonators in the filter.

8. The filter of claim 7, wherein an edge of the second insulation slot most distant from the second central signal line is an arc line.

9. The filter of claim 7, wherein the two coupled CPW slow-wave resonators are symmetrically disposed.

10. The filter of claim 7, wherein the first ground plane and the second ground plane that are on a same side of the first central signal line and the second central signal line are coupled together.

11. The filter of claim 7, wherein the transmission line with the stepped impedance change is a T-shaped transmission line, and wherein the filter further comprises a third ground plane on each of two sides of the T-shaped transmission line.

12. The filter of claim 11, wherein the first ground plane, the second ground plane, and the third ground plane that are on a same side of the first central signal line, the second central signal line, and the T-shaped transmission line are coupled together.

13. The filter of claim 12, wherein the first ground plane on each of the two sides of the first central signal line, the second ground plane on each of the two sides of the second central signal line, and the third ground plane on each of the two sides of the T-shaped transmission line are coupled together using a connection component.

14. The filter of claim 13, wherein the connection component is a metal jumper wire or an air bridge.

15. The filter of claim 13, wherein two ends of the connection component are respectively disposed on two sides of the T-shaped transmission line, and the connection component crosses the T-shaped transmission line and is insulated from the T-shaped transmission line.

16. The filter of claim 7, wherein the at least one filter comprises two adjacent filters that are magnetically coupled, and wherein two adjacent CPW transmission lines of the two adjacent filters are coupled together.

17. The filter of claim 7, wherein the at least one filter comprises two adjacent filters that are electrically coupled, and wherein there is a gap between two adjacent CPW transmission lines of the two adjacent filters.

18. The filter of claim 7, wherein the filter is a passband filter.

19. The filter of claim 7, wherein an edge of the second insulation slot most distant from the second central signal line is a straight line.

20. The filter of claim 7, wherein a slot width of the second insulation slot gradually decreases from a first width to a second width, wherein the second width is less than the first width.

* * * * *